United States Patent
Garreau et al.

(10) Patent No.: US 7,782,262 B2
(45) Date of Patent: Aug. 24, 2010

(54) DEVICE FOR CONTROLLING THE SPECIFIC ABSORPTION RATE OF MASS-PRODUCED RADIANT OBJECTS

(75) Inventors: Philippe Garreau, Mennecy (FR); Luc Duchesne, Angervilliers (FR); Jean-Charles Bolomey, Paris (FR)

(73) Assignee: Societe d'Applications Technologiques de l'Imagerie Micro Ondes (FR)

( * ) Notice: Subject to any disclaimer, the term of this patent is extended or adjusted under 35 U.S.C. 154(b) by 882 days.

(21) Appl. No.: 10/568,490

(22) PCT Filed: Aug. 18, 2004

(86) PCT No.: PCT/FR2004/002154
§ 371 (c)(1),
(2), (4) Date: Oct. 16, 2006

(87) PCT Pub. No.: WO2005/019843
PCT Pub. Date: Mar. 3, 2005

(65) Prior Publication Data
US 2007/0063905 A1    Mar. 22, 2007

(30) Foreign Application Priority Data
Aug. 18, 2003    (FR) .................................. 03 09994

(51) Int. Cl.
*G01R 29/10*    (2006.01)
(52) U.S. Cl. .................. 343/703; 343/718; 343/756; 343/786
(58) Field of Classification Search .................. 343/703, 343/718, 786, 761, 778, 756; 422/50, 68.1
See application file for complete search history.

(56) References Cited

U.S. PATENT DOCUMENTS

| | | | |
|---|---|---|---|
| 5,440,316 A | 8/1995 | Podgorski et al. | |
| 6,018,276 A * | 1/2000 | Hirota et al. | 333/26 |
| 6,211,750 B1 * | 4/2001 | Gould | 333/21 A |
| 7,186,377 B2 * | 3/2007 | Iyama et al. | 422/50 |
| 7,511,511 B2 * | 3/2009 | Onishi et al. | 324/632 |
| 7,583,089 B2 * | 9/2009 | Onishi et al. | 324/632 |
| 2002/0160717 A1 * | 10/2002 | Persson et al. | 455/67.1 |
| 2006/0114003 A1 * | 6/2006 | Onishi et al. | 324/632 |

FOREIGN PATENT DOCUMENTS

WO    WO-01/75460 A1    10/2001

* cited by examiner

*Primary Examiner*—Douglas W Owens
*Assistant Examiner*—Chuc D Tran
(74) *Attorney, Agent, or Firm*—Lerner, David, Littenberg, Krumholz & Mentlik, LLP

(57) ABSTRACT

The invention relates to a device for controlling the specific absorption rate of mass-produced radiant objects. The inventive device is characterized in that it comprises: at least one sensor for measuring a power radiated by an object which is located in the zone, and at least one processing unit for analyzing the power thus measured. The aforementioned sensor consist of a waveguide comprising an opening which is disposed opposite the test zone and at least one measuring probe which is disposed inside the waveguide.

15 Claims, 4 Drawing Sheets

DEVICE FOR CONTROLLING THE SPECIFIC ABSORPTION RATE OF MASS-PRODUCED RADIANT OBJECTS

The present application is the National Stage of International Application No. PCT/FR2004/00215, filed on Aug. 18, 2004.

The present invention pertains to the control (monitoring) of the specific absorption rate, also termed the SAR, of mass-produced radiant objects and in particular of portable telephones.

It is known that the level of exposure to electro-magnetic waves of users of portable telephones is fixed by standards which generally define the maximum acceptable SAR for a mass of given biological tissue.

In this regard, standards exist in particular in Europe, the United States and Japan.

However, the measurement procedures which are defined by these standards are relatively complex and irksome to implement.

Generally, these standards provide that the integrated maximum SAR, denoted or <SAR>, be calculated on the basis of a plurality of measurements of electric field in a homogeneous phantom reproducing conditions very much like those of the biological, media corresponding to the human body.

Thus, for example in Europe, the volume explored is about a cube of side 2 cm and the sampling interval is a few millimeters, so that the number of measurements to be performed is of the order of several hundred. These measurements must moreover be repeated for at least two positions of the portable telephone With respect to the phantom, on either side of the latter, as well as for at least three frequencies (or six for dual-band portables).

It is therefore understood that the protocols proposed by these standards documents are especially lengthy and that it is inconceivable to test in this way all portable telephones which may be placed on the market.

There therefore exists a need for a test allowing rapid control (monitoring) of these portable telephones at the end of production.

For this purpose, the invention proposes a device for controlling the specific absorption rate of mass-produced radiant objects, characterized in that it comprises at least one sensor for measuring a power radiated by an object situated at the level of said zone and at least one processing unit which analyzes the power thus measured, the sensor comprising a waveguide exhibiting an opening disposed opposite the test zone and at least one measurement probe disposed inside said waveguide.

Such a device is advantageously supplemented with the following various characteristics taken alone or according to all their technically possible combinations:
  it comprises means for conveying the objects up to the test zone.
  the sensor furthermore comprises a phantom in a material having dielectric properties similar to those of biological tissues, and in which the waveguide is immersed.
  the phantom is of cylindrical or more complex shape.
  the waveguide is of rectangular or circular cross section, which can optionally be varied to form a horn.
  the waveguide is a horn.
  the sensor comprises at least two orthogonal probes placed inside the waveguide.
  the waveguide comprises two pairs of orthogonal probes.
  the two pairs of probes are linked to processing means, allowing in particular deviometry to be implemented.
  the processing unit instructs the displaying on a screen of a curve whose amplitude and extent are dependent on the radiated power measured by the sensor and whose position is dependent on the deviometry measurements.
  the device comprises an array of several sensors exhibiting various orientations.
  in the case where the radiant objects are cellular communication terminals, it comprises upstream of the test zone a base station simulator.
  the device comprises upstream of the sensor or sensors guiding means, able to impose a certain positioning on the radiant objects.
  the processing unit stores matches between values of integrated specific absorption rates and values of electrical powers, these matches being determined beforehand by calibration.

Advantageously also, tests are implemented in the course or at the end of production by sampling objects from the production plant and analyzing them in a shielded and anechoic container containing a sensor or an array of waveguide sensors and measurement probes.

Other characteristics and advantages of the invention will become further apparent from the description which follows, which is purely administrative and nonlimiting and should be read in conjunction with the appended drawings in which:

FIG. 1 illustrates a test zone equipped with a device in accordance with a possible embodiment of the invention.

FIG. 2 diagrammatically illustrates a possible exemplary sensor.

FIG. 3 diagrammatically illustrates another possible exemplary, sensor.

Figure 1:
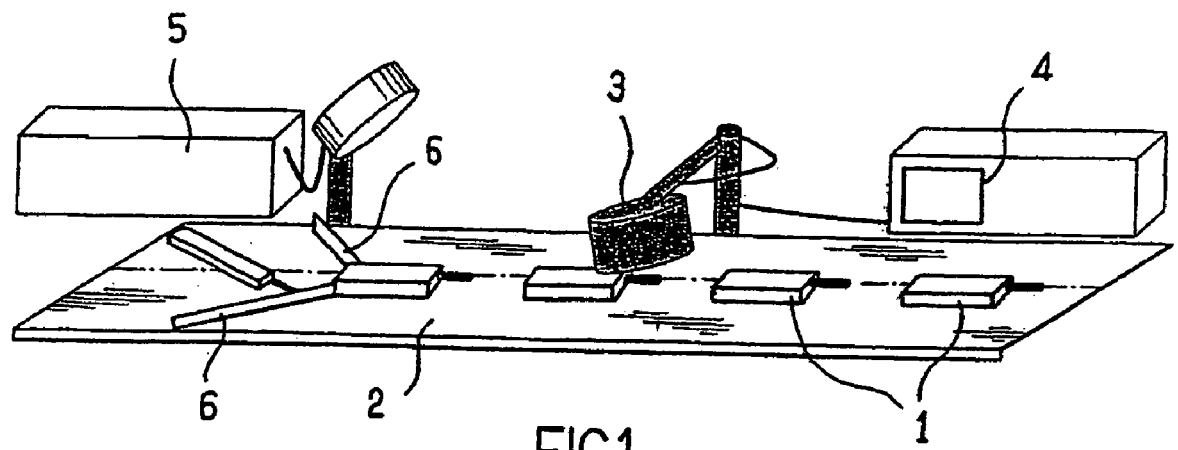

Represented in FIG. 1 is a zone which is disposed for example at the end of a line for manufacturing portable telephones 1 and which is equipped with a device making it possible to test the integrated SAR of the telephones produced.

The portable telephones 1 are transported thereto on a conveyor belt 2 which causes them to pass through said test zone.

This test zone comprises in particular one or more sensor (s) 3 which are disposed opposite or near the conveyor belt 2, above and/or below the latter, and which make it possible to measure the integrated SAR. The sensor or sensors 3 are linked to a processing unit 4. They are disposed, with respect to the direction of drive of the conveyor belt 2, downstream of a base station simulator 5.

The role of the simulator 5 is to activate the portable telephones 1 which arrive in the test zone so that they are in a state where they emit their maximum power Pmax when they are at the level of the test zone and when they travel past the sensor or sensors 3.

Guiding ramps 6 are disposed just above the conveyor belt 2, upstream of the test zone, and make it possible to force the portable telephones to orient themselves in a predefined manner, for example in such a way that their longitudinal axis coincides substantially with the axis along which they are driven by said conveyor belt 2 when they are in the test zone.

An exemplary sensor 3 will now be more precisely described with reference to FIGS. 2 and 3.

This sensor 3 comprises a metal structure 7 which defines a waveguide which is able to guide the electro-magnetic waves so as to control their propagation up to at least two orthogonal detection probes 8 and 9, which make it possible to measure the electric field in two directions of polarization.

The electric field thus measured is transmitted to the processing unit 4 which determines the electrical power which corresponds to the field thus measured along two directions of polarization. A simplified procedure may be envisaged in which one merely measures the predominant component of the electric field whose state of polarization will have been analyzed previously. In this case it suffices to measure this component alone of the field through a suitable orientation of the sensor.

Figure 2:
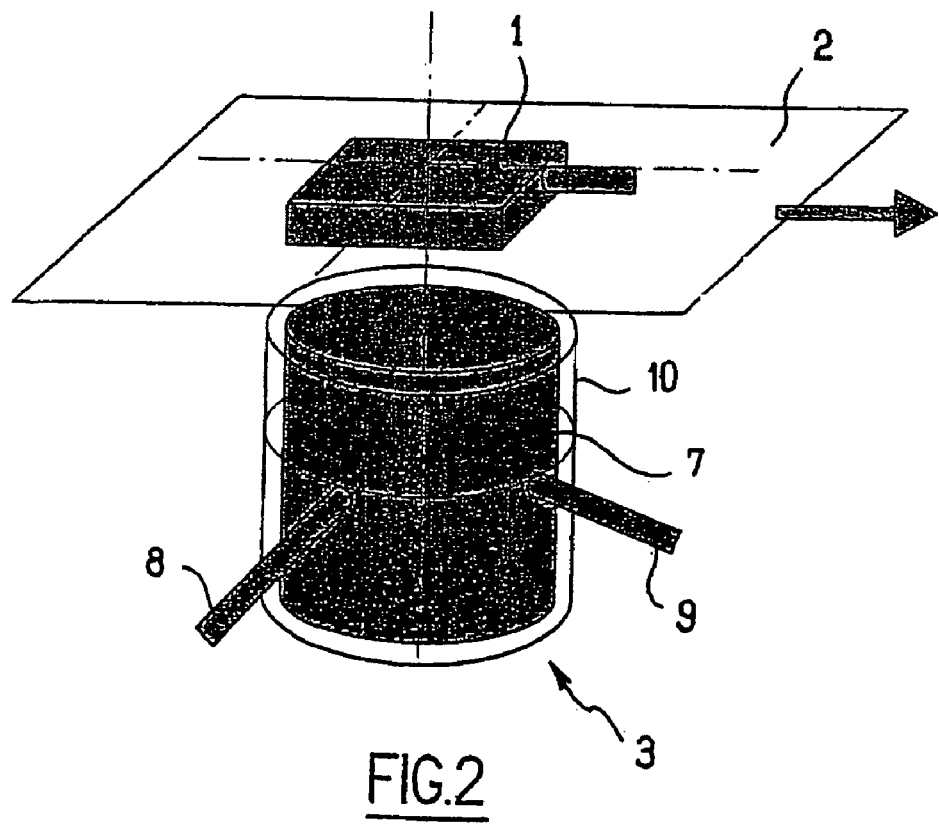

In the case illustrated in FIG. 2, the waveguide 7 is of cylindrical shape.

Figure 3:
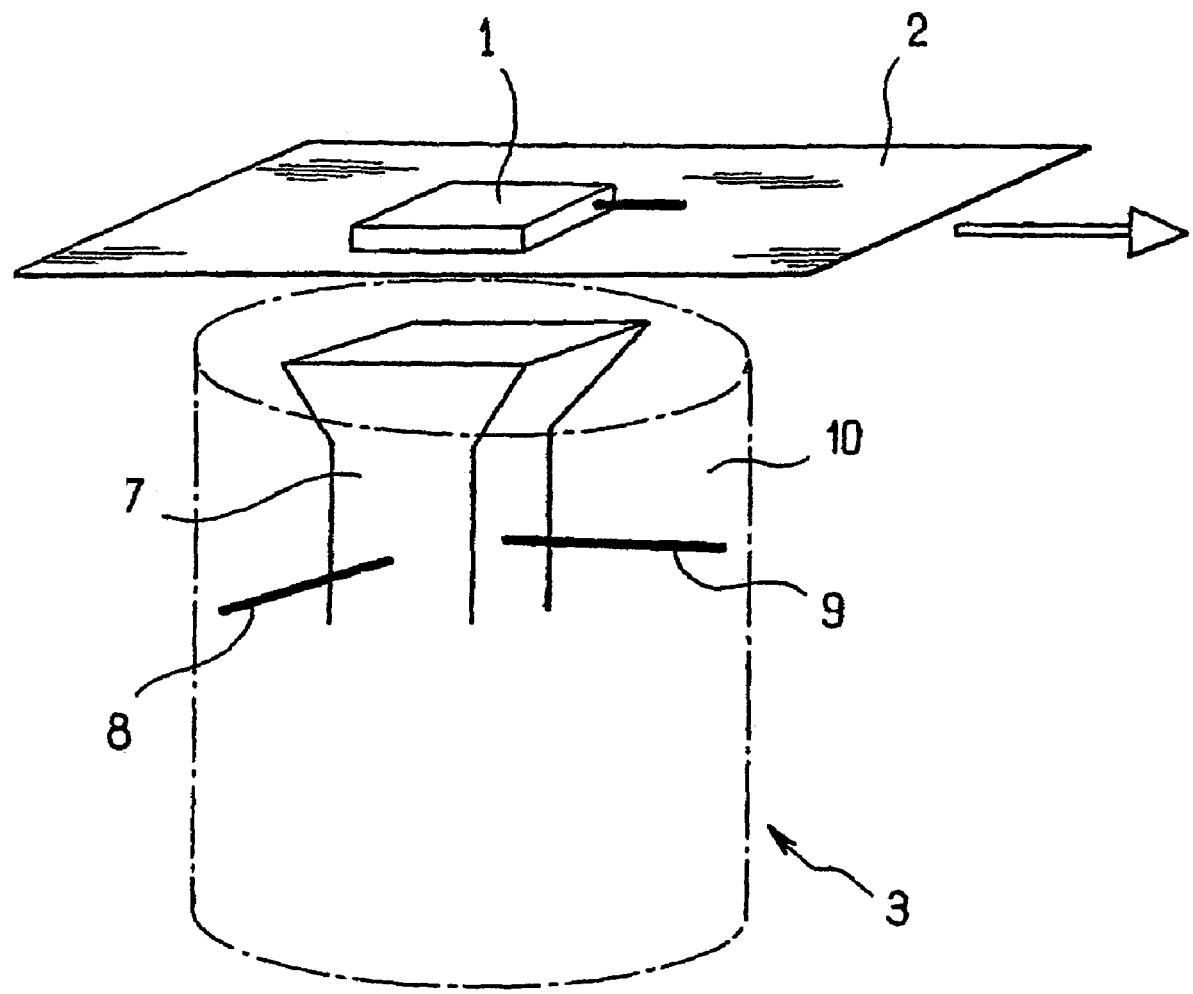

Advantageously also, as illustrated in FIG. 3, this waveguide 7 may be a horn waveguide, so as to make it possible to confine the waves while allowing integration over a maximum entrance area.

This waveguide 7, be it cylindrical, horn-shaped or the like, is immersed in a material filling a phantom 10 whose dielectric properties correspond to those of biological tissues.

The material is advantageously an equivalent liquid.

The phantom is for example of comparable shape to the shapes customarily proposed in standards documents (generic phantoms of simple shape (spheres in particular) or anthropomorphic phantoms).

For example, as illustrated in FIGS. 2 and 3, it may be of cylindrical shape.

In this case, a saving is made in terms of bulk, complexity-of embodiment and cost.

It will be noted in this regard that reduced bulk allows the construction of arrays of juxtaposed probes.

Figure 4:
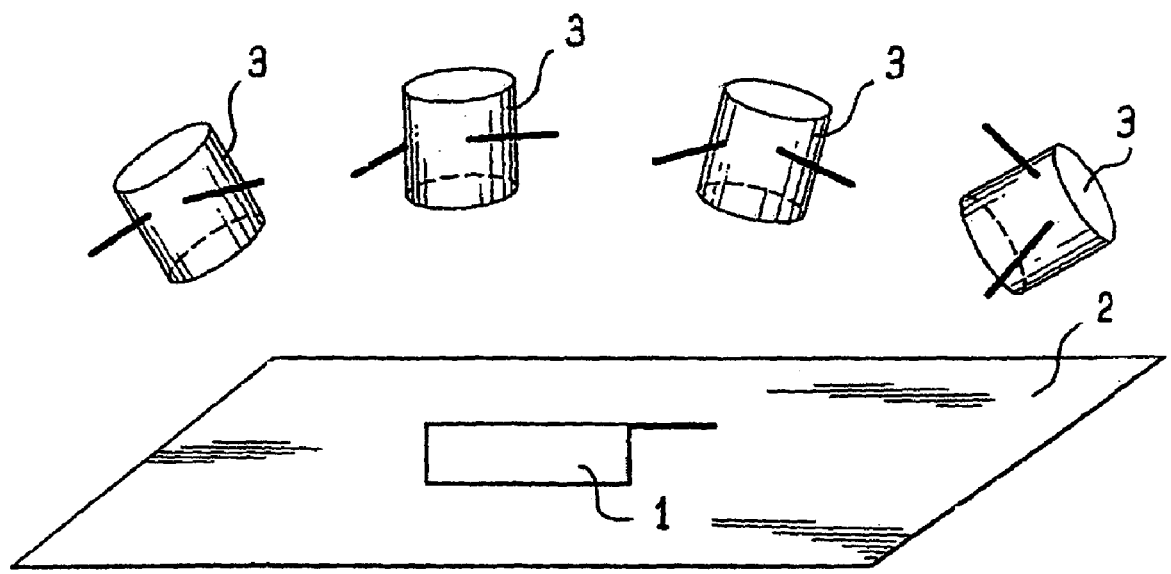
FIG. 4 illustrates the use of a plurality of sensors distributed in an arch.

This is the particular case illustrated in FIG. 4 in which is represented an array of sensors 3 disposed in an arch around the zone through which the portable telephones 1 pass.

Such an array of arch-like probes makes it possible to tolerate a certain absence dispersion of alignment of the portable telephones with respect to the principal axis of displacement of the belt and to vary the test configurations.

It will be noted that the waveguide 7 of a sensor of the type of those illustrated in FIGS. 2 and 3 is disposed at a distance fairly close to the antennas of the portable telephones as in a regular test, typically of the order of a few mm to a few cm.

Figure 5A:
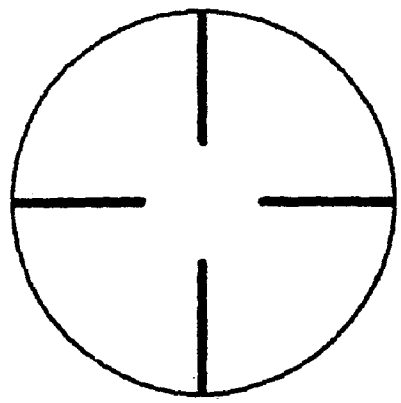
FIGS. 5a and 5b are diagrammatic cross-sectional representations of sensors with four probes in the case on the one hand of a waveguide sensor of circular cross section (FIG. 5a) and on the other hand of a wave-guide sensor of square cross section (FIG. 5b).
Figure 5B:
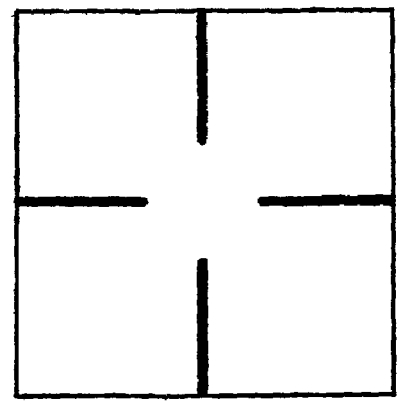

Moreover, such a sensor 3 advantageously comprises, as illustrated by FIGS. 5a and 5b, not two probes but four orthogonal probes. The use of four probes or antennas allows, in fact, deviometric measurements making it possible to supply information regarding the location and the extent of the zone or "spot" of dissipation, of power in the phantom.

Figure 6:
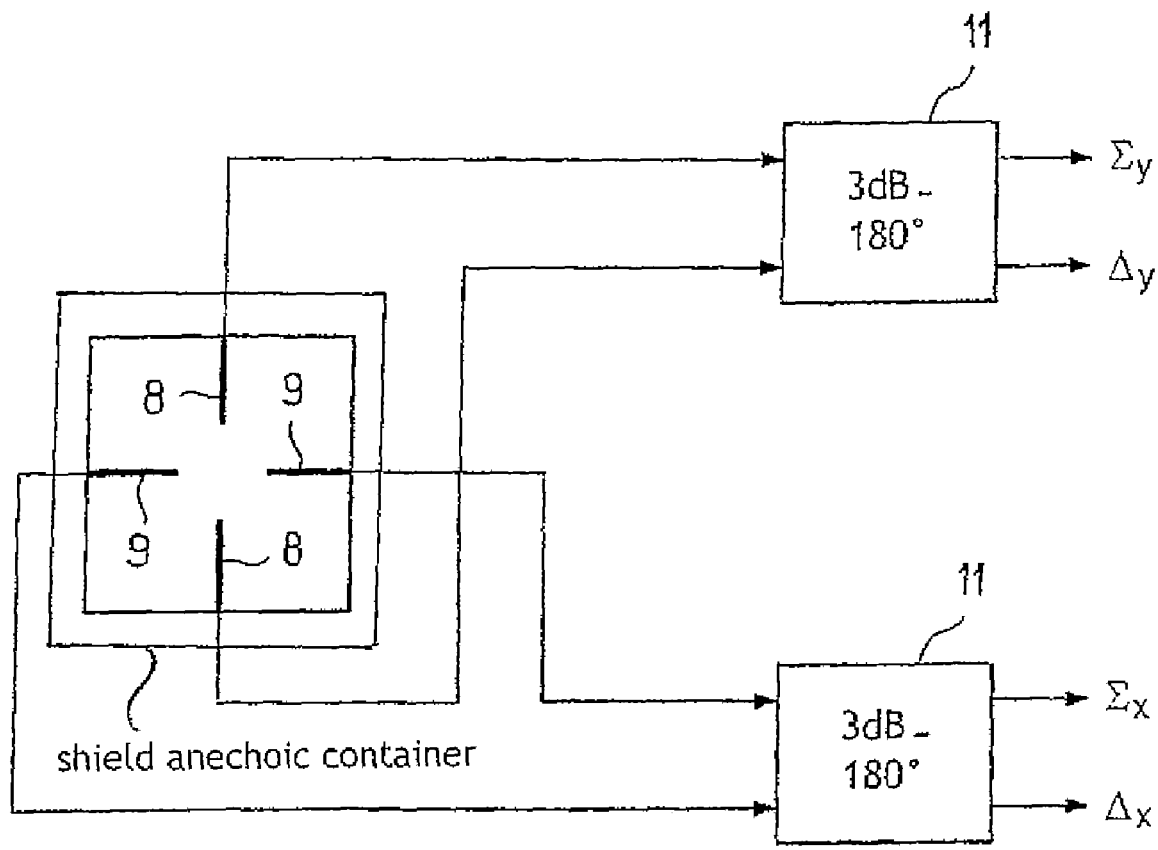
FIG. 6 is a diagram illustrating the principle of a deviometry arrangement embodied with a four-probe sensor.

For this purpose, use is advantageously made, as illustrated in FIG. 6, of 3dB-180° couplers (referenced by 11) making it possible to calculate the sums and differences of the amplitudes of the field measured by the probes along on the one hand a first axis (X axis) and on the other hand a second axis (Y axis). These sum and difference signals are themselves sent to the processing unit 4 where they are analyzed so as to deduce therefrom the SAR and complementary information regarding the position and/or the orientation of the portable telephone 1 as well as regarding possible malfunctions.

Specifically, this deviometric measurement allows position control (monitoring) of the telephones under test and may turn out to be useful in the diagnosis afforded for any difference between the measurements observed on a telephone and the reference measurements with which it ought to match up. It also affords a better assessment of the extent over which the power is distributed.

Provision is furthermore advantageously made for the processing unit 4 to display on a screen a spot whose intensity and extent are dependent on the electrical power measured and whose position will be that deduced from the intensities of the deviometry curves.

The information regarding the measurement of integrated field, measured with the device just described is advantageously used to deduce therefrom, using the prestored match-up tables, the integrated <SARs> of the portable telephones analyzed.

For this purpose prior use is made of calibration procedures making it possible to match up the field measurements performed by the sensor and portable telephone integrated SARs such as measured in a standardized measurement bench.

The <SAR> is in fact very tightly correlated with the power dissipated in the phantom, which power depends essentially on the phantom used (shape, dimensions, dielectric characteristics, etc.), on the portable telephone (type of antenna, coupling of the housing, etc.), on the relative position of the portable with respect to the phantom.

The use of a waveguide sensor makes it possible to integrate the power flux through its opening and in this way to make an overall measurement of the power dissipated in the phantom, which power, for a given type of telephone and type of phantom for a relative position of the telephone with respect to the phantom, may be directly linked, through a match-up table, to a value of <SAR>.

It will also be noted that the device can also be placed in a shielded and anechoic container containing a sensor or an array of waveguide sensors and measurement probes. Such a container makes it possible to implement tests by sampling objects from the production plant.

It may be used alone or as a supplement for sensors disposed alongside the conveying plant, for example with a view to a more thorough test.

This test device just described has numerous advantages.

It allows a fast test procedure (several telephones per minute).

It yields a real-time indication of compliance and/or an estimate of <SAR> allowing sorting on the radiant objects (telephones or the like) produced and possibly an indication of diagnosis with a view to possible recycling.

It is cheap.

It is noninvasive.

It is easy to integrate into a manufacturing line.

It requires a reduced number of probes, typically 2 to 4.

The invention claimed is:

1. A device for controlling the specific absorption rate of mass-produced radiant objects, comprising a test zone comprising at least one sensor for measuring a power radiated by an object situated at the level of said test zone and at least one processing unit which analyzes the power thus measured, the sensor comprising a waveguide exhibiting an opening disposed opposite the test zone and at least one measurement probe disposed inside said waveguide.

2. The device as claimed in claim 1, characterized in that it comprises means for conveying the objects up to the test zone.

3. The device of claim 1 wherein the sensor further comprises a phantom in a material having dielectric properties similar to those of biological tissues, and in which the waveguide is immersed.

4. The device of claim 3 wherein the phantom is of cylindrical shape or more complex shape.

5. The device of claim 1 wherein the waveguide is of rectangular cross-section or circular cross-section or more complex cross section.

6. The device of claim 1 wherein the waveguide is a horn.

7. The device of claim 1 further comprising at least two orthogonal probes which run inside the waveguide.

8. The device as claimed in claim 7, wherein the waveguide comprises two pairs of orthogonal probes for deviometric processing.

9. The device as claimed in claim 8, wherein the two pairs of probes are linked to a deviometry means.

10. The device as claimed in claim 9, wherein the processing unit instructs the displaying on a screen of a curve wherein the amplitude and the extent are dependent on the radiated power measured and wherein a position is dependent on the deviometry measurements.

11. The device as claimed in claim 1 further comprising an array of sensors exhibiting various orientations.

12. The device as claimed in claim 1 wherein the radiant objects are cellular communication terminals, and further comprising, upstream of the test zone, a base station simulator.

13. The device as claimed in claim 1 further comprising upstream of the at least one sensor guiding means able to impose a certain positioning on the radiant objects.

14. The device as claimed in claim 1, wherein the processing unit stores matches between values of integrated specific absorption rates and values of electrical powers, these matches being determined beforehand by calibration.

15. The device as claimed in claim 1 wherein the device further comprises a shielded and anechoic container containing a sensor or an array of waveguide sensors and measurement probes.

* * * * *

UNITED STATES PATENT AND TRADEMARK OFFICE
CERTIFICATE OF CORRECTION

PATENT NO. : 7,782,262 B2  
APPLICATION NO. : 10/568490  
DATED : August 24, 2010  
INVENTOR(S) : Philippe Garreau, Luc Duchesne and Jean-Charles Bolomey Page 1 of 1

It is certified that error appears in the above-identified patent and that said Letters Patent is hereby corrected as shown below:

Title Page, Item (73) Assignee: "Micro Ondes" should read --Micro-Ondes--.
Title Page, Item (57) Abstract, line 17, "consist of" should read --consists of--.
Column 1, line 25, "biological, media" should read --biological media--.
Column 1, line 32, "telephone With respect" should read --telephone with respect--.
Column 2, lines 30-31, "exemplary, sensor" should read --exemplary sensor--.
Column 3, line 33, "complexity-of" should read --complexity of--.
Column 3, line 53, "dissipation, of" should read --dissipation of--.
Column 4, line 10, "described is" should read --described, is--.
Column 5, line 3, "complex cross section" should read --complex cross-section--.

Signed and Sealed this  
Twenty-third Day of August, 2011

David J. Kappos  
*Director of the United States Patent and Trademark Office*

UNITED STATES PATENT AND TRADEMARK OFFICE
CERTIFICATE OF CORRECTION

| | | |
|---|---|---|
| PATENT NO. | : 7,782,262 B2 | Page 1 of 1 |
| APPLICATION NO. | : 10/568490 | |
| DATED | : August 24, 2010 | |
| INVENTOR(S) | : Philippe Garreau, Luc Duchesne and Jean-Charles Bolomey | |

It is certified that error appears in the above-identified patent and that said Letters Patent is hereby corrected as shown below:

Title Page, Item (73) Assignee: "Micro Ondes" should read --Micro-Ondes--.
Title Page, Item (57) Abstract, line 7, "consist of" should read --consists of--.
Column 1, line 25, "biological, media" should read --biological media--.
Column 1, line 32, "telephone With respect" should read --telephone with respect--.
Column 2, lines 30-31, "exemplary, sensor" should read --exemplary sensor--.
Column 3, line 33, "complexity-of" should read --complexity of--.
Column 3, line 53, "dissipation, of" should read --dissipation of--.
Column 4, line 10, "described is" should read --described, is--.
Column 5, line 3, "complex cross section" should read --complex cross-section--.

This certificate supersedes the Certificate of Correction issued August 23, 2011.

Signed and Sealed this
Seventh Day of February, 2012

David J. Kappos
*Director of the United States Patent and Trademark Office*